(12) United States Patent
Cho et al.

(10) Patent No.: US 7,662,300 B1
(45) Date of Patent: Feb. 16, 2010

(54) METHOD FOR PREPARING POROUS MATERIAL USING NANOSTRUCTURES AND POROUS MATERIAL PREPARED BY THE SAME

(75) Inventors: Kyung Sang Cho, Gwacheon-si (KR); Byoung Lyong Choi, Seoul (KR); Eun Kyung Lee, Suwon-si (KR); Soon Jae Kwon, Seongnam-si (KR); Jae Ho Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 630 days.

(21) Appl. No.: 11/444,116

(22) Filed: May 31, 2006

(30) Foreign Application Priority Data

Apr. 5, 2006  (KR) ...................... 10-2006-0030969

(51) Int. Cl.
*B31D 3/00* (2006.01)
(52) U.S. Cl. ..................................... 216/56; 427/249.1
(58) Field of Classification Search .............. 427/249.1; 423/447.3; 428/408; 216/56
See application file for complete search history.

(56) References Cited

U.S. PATENT DOCUMENTS 6,129,901 A * 10/2000 Moskovits et al. ....... 423/447.3
6,312,303 B1 * 11/2001 Yaniv et al. .................... 445/24
7,422,696 B2 * 9/2008 Mirkin et al. ................... 216/2
2004/0169007 A1 * 9/2004 Sander et al. .................. 216/33

OTHER PUBLICATIONS

Huang, Y., et al., "Directed Assembly of One-Dimensional Nanostructures Into Functional Networks," Science, vol. 291, pp. 630-633 (2001).
Shchukin, D., et al., "Template Synthesis and Photocatalytic Properties of Porous Metal Oxide Spheres Formed by Nanoparticle Infiltration," Chem. Mater., vol. 16, pp. 2287-2292 (2004).

\* cited by examiner

*Primary Examiner*—Roberts Culbert
(74) *Attorney, Agent, or Firm*—Cantor Colburn LLP

(57) ABSTRACT

Disclosed herein is a method for preparing a porous material using nanostructures. The method comprises the steps of producing nanostructures using a porous template, dispersing the nanostructures in a source or precursor material for the porous material, aligning the nanostructures in a particular direction, and removing the nanostructures by etching. According to the method, the size, shape, orientation and regularity of pores of the porous material can be easily controlled, and the preparation of the porous material is simplified, leading to a reduction in preparation costs.

Further disclosed is a porous material prepared by the method.

14 Claims, 3 Drawing Sheets

SLS method

VLS method

METHOD FOR PREPARING POROUS MATERIAL USING NANOSTRUCTURES AND POROUS MATERIAL PREPARED BY THE SAME

This non-provisional application claims priority under 35 U.S.C. §119(a) on Korean Patent Application No. 2006-30969 filed on Apr. 5, 2006 which is herein incorporated by reference.

BACKGROUND OF THE INVENTION

1. Field of the Invention

The present invention relates to a method for preparing a porous material using nanostructures and a porous material prepared by the method. More specifically, the present invention relates to a method for preparing a porous material using nanostructures by producing nanostructures using a porous template, dispersing the nanostructures in a source or precursor material for the porous material, aligning the nanostructures in a particular direction and removing the nanostructures by etching, and a porous material prepared by the method.

2. Description of the Related Art

Porous materials, through which fluids are allowed to flow, are classified into microporous materials having a pore size of less than 2 nm, mesoporous materials having a pore size ranging from 2 to 50 nm, and macroporous materials having a pore size of more than 50 nm according to the pore size of the porous materials. Of these porous materials, mesoporous materials have a sufficiently large pore size to permit fluids to freely pass therethrough and a relatively large surface area where they are in contact with fluids. Based on these advantages, mesoporous materials have drawn attention as materials for catalysts, catalyst supports, adsorbents, separators and electric double-layer capacitors. Particularly, since nanoporous materials having a mesopore size, which can be synthesized using numerous precursors, can be used in the production of highly functional catalysts, catalyst supports, separators, hydrogen storage materials, adsorbents, photonic crystal bandgap materials, etc., they are currently in the spotlight. Examples of porous materials include inorganic materials, metals, polymers and carbon materials. Of these, carbon materials have superior chemical, mechanical and thermal stability, and are useful in a variety of applications.

However, it is not easy to prepare porous materials having a structure in which pores are connected to each other. It is particularly difficult to control the pore morphology of porous materials. Under these circumstances, methods for controlling the internal structures (e.g., pore size and porosity) of porous materials using templates have been proposed. For example, a proposal has been made on a method for producing porous carbon structures by filling a carbon precursor into a solid porous silica template, carbonizing the carbon precursor under non-oxidizing conditions, and dissolving the silica template in a HF or NaOH solution to remove the template.

In addition, a method for producing porous metal oxide spheres using porous polymer beads as templates has been proposed (Template Synthesis and Photocatalytic Properties of Porous Metal Oxide Spheres Formed by Nanoparticle Infiltration, Chem. Mater. 2004, 16, 2281-2292). This method comprises the step of dipping the porous polymer beads in a metal oxide sol. Since the method has an advantage in that porous materials having a uniform size and a regular lattice arrangement can be prepared, it is widely employed for the preparation of porous materials. According to the method, however, the controllable size of the beads is as large as 100 nm to several micrometers. The method has a limitation in preparing porous material having a pore size of a few to a few tens of nanometers. Moreover, the method has a problem in that the shape of pores cannot be controlled because the polymer beads have a spherical shape.

SUMMARY OF THE INVENTION

Therefore, the present invention has been made in view of the prior art problems, and it is one object of the present invention to provide a method for preparing a porous material using nanostructures by which the size and shape of pores of the porous material are easily controlled and the preparation of the porous material is simplified, leading to a reduction in preparation costs.

It is another object of the present invention to provide a porous material prepared by the method.

In accordance with one aspect of the present invention for achieving the above objects, there is provided a method for preparing a porous material using nanostructures, the method comprising the steps of:

(a) producing nanostructures using a porous template;
(b) dispersing the nanostructures in a source or precursor material for the porous material;
(c) aligning the nanostructures in a particular direction; and
(d) removing the nanostructures by etching.

The nanostructures used in the preparation of the porous material may be nanorods, nanowires, or nanotubes.

The step of producing nanostructures may include the sub-steps of:

i) providing a porous template having a plurality of holes;
ii) producing nanostructures using the template by a solid-liquid-solid (SLS) or vapor-liquid-solid (VLS) method; and
iii) removing the template.

In accordance with another aspect of the present invention, there is provided a porous material prepared by the method.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

The present invention will now be described in greater detail with reference to the accompanying drawings.

A method for preparing a porous material according to the present invention is characterized by the use of nanostructures produced using a porous template. Specifically, the nanostructures are produced using a porous template having a plurality of holes. Examples of the nanostructures include, but are not limited to, nanowires, nanorods, and nanotubes.

Figure 1:
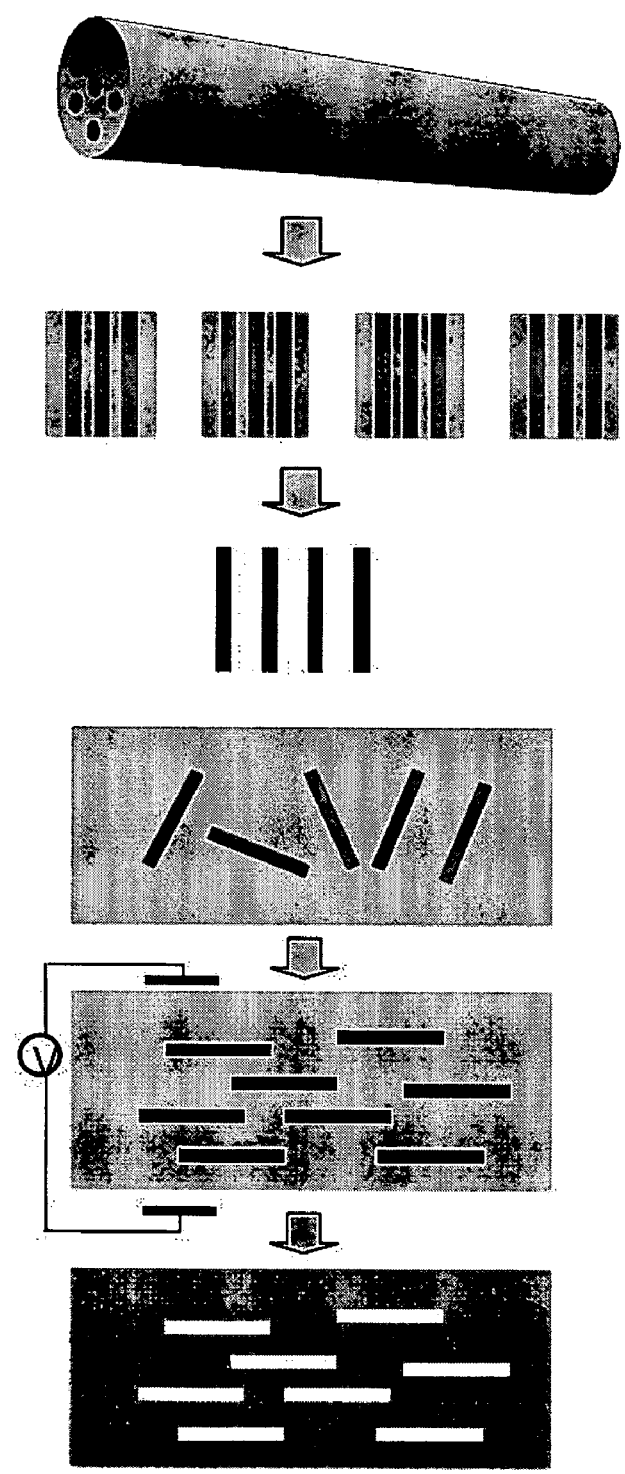
FIG. 1 shows schematic diagrams illustrating the procedure of a method for preparing a porous material using nanostructures according to one embodiment of the present invention.

FIG. 1 shows schematic diagrams illustrating the procedure of a method for preparing a porous material using nanostructures according to one embodiment of the present invention. With reference to FIG. 1, a porous material is prepared by the following procedure. First, nanostructures are produced using a porous template (step (a)). Then, the nanostructures are dispersed in a source or precursor material for the porous material (step (b)). An electric field is applied to the dispersion to align the nanostructures in a particular direction (step (c)). Finally, the nanostructures are removed by etching, leaving the final porous material (step (d)).

A more detailed explanation of the respective steps of the method according to the present invention will be provided below.

Step (a): Production of Nanostructures

Figure 2:
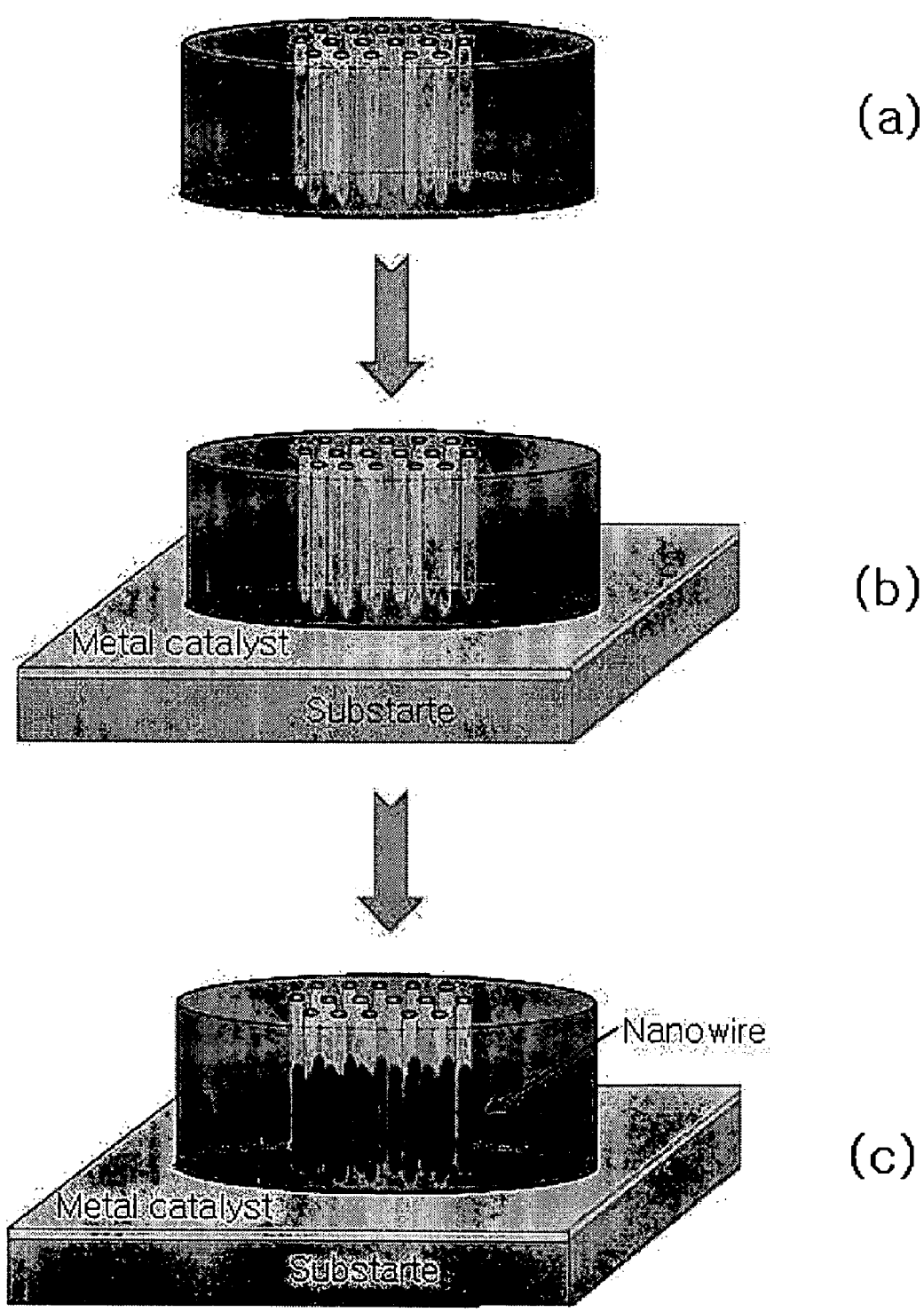
FIG. 2 shows schematic diagrams illustrating the procedure of a method for producing nanostructures according to one embodiment of the present invention.

When it is intended to produce nanostructures using a porous template, as shown in FIG. 2, a porous template having a plurality of long holes in the form of channels is provided, and then nanostructures are produced using the porous template by a solid-liquid-solid (SLS) or vapor-liquid-solid (VLS) method. Finally, the template is removed.

i) Provision of Porous Template

Since the size and length of the porous template and the spacing between holes of the template can be appropriately varied during the manufacture of the template, nanostructures suitable for the desired applications can be produced. Accordingly, the pore size, shape and regularity of the final porous material can be easily controlled.

The template used in the method of the present invention can be made of a material selected from the group consisting of glass, silica, and metal oxides, such as $TiO_2$, $ZnO$, $SnO_2$ and $WO_3$. The porous template may be embedded within a matrix formed of a metal oxide or an insulating polymer.

The template is basically manufactured by preparing a template preform and extracting a template form from the template preform. The formation of holes is determined depending on the extraction speed and cooling conditions. Particularly, by previously processing the desired hole shape of the preform, a structure in which the initial shape is reduced to a nanometer scale can be attained by extraction.

Since the diameter and height of the porous template have a high degree of freedom, they can be selected according to the size of a substrate on which nanostructures are grown. It is preferred that the template have a diameter of 1 nm to 1 mm and a height of 100 nm to 1 mm. Depending on the size of the substrate, two or more templates may be used. The diameter of the holes formed within the porous template and spacing between the holes vary depending upon the specification of nanostructures to be produced. It is preferred that the holes have a diameter of 1 to 100 nm and a spacing of 2 nm to 1 μm.

ii) Production of Nanostructures

Nanostructures used in the present invention can be made of a metal oxide, a metal nitride, a semiconductor, a metal, a polymer, or carbon nanotubes. Examples of suitable semiconductors include Group II-VI, Group III-V, Group IV-VI, and Group IV compound semiconductors.

The porous template is placed on a metal catalyst layer overlying a substrate. The metal catalyst layer is formed by coating a substrate with a metal catalyst, e.g., gold (Au). At this time, the substrate may be previously washed by known techniques to remove impurities present thereon.

As the substrate, there can be exemplified a silicon substrate or a silicon-on-glass substrate.

The metal catalyst coated on the silicon substrate is not particularly restricted so long as nanostructures can be grown thereon. Non-limiting examples of metal catalysts that can be used in the present invention include Au, Ni, Fe, Ag, Pd, and Pd/Ni. The metal catalyst used in the present invention can be coated in the form of nanoparticles or can be formed into a thin film on the substrate. The metal catalyst layer formed on the substrate preferably has a thickness of 50 nm or less.

The metal catalyst can be deposited on the substrate by common coating processes, including chemical vapor deposition (CVD), sputtering, e-beam evaporation, vacuum evaporation, spin coating, and dipping.

After formation of the catalyst layer on the substrate, nanostructures are grown by a solid-liquid-solid (SLS) or vapor-liquid-solid (VLS) method.

Figure 3:
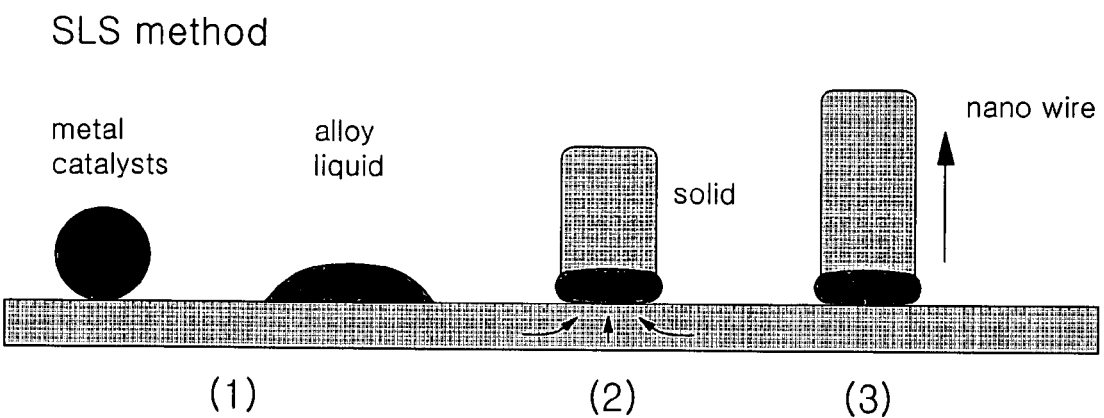
FIG. 3 is a schematic diagram illustrating the procedure of a method for producing nanostructures by a solid-liquid-solid (SLS) method.

According to the solid-liquid-solid (SLS) method shown in FIG. 3, nanostructures are produced by condensing silicon diffused from a solid substrate (e.g., silicon substrate) on the surface of the molten catalyst without supply of vapor phase silicon to form a crystal, and growing the crystal.

Figure 4:
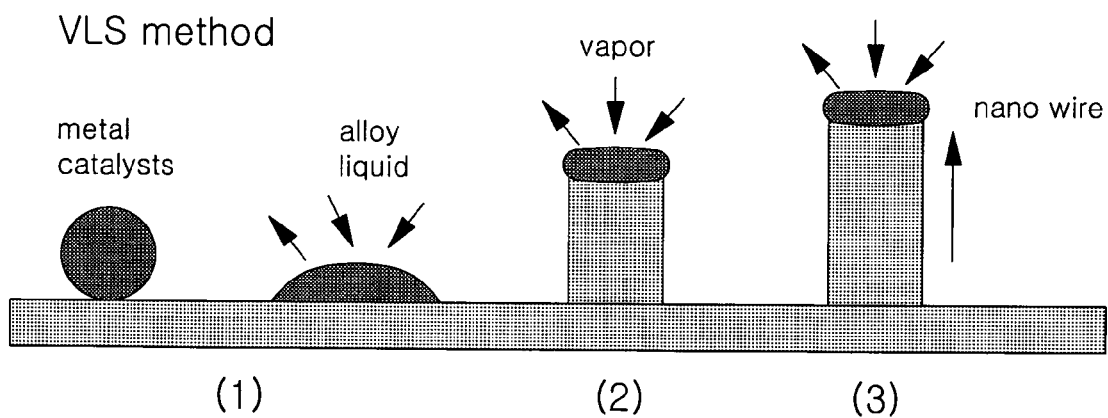
FIG. 4 is a schematic diagram illustrating the procedure of a method for producing nanostructures by a vapor-liquid-solid (VLS) method.

On the other hand, according to the vapor-liquid-solid (VLS) method shown in FIG. 4, silicon nanostructures are produced by condensing a vapor phase silicon-containing species supplied from a high-temperature reaction furnace on the surface of a molten catalyst, such as molten gold, cobalt or nickel, to form a crystal, and growing the crystal.

Specifically, the solid-liquid-solid (SLS) method employed in the present invention can be carried out by introducing the substrate on which the template is placed into a reaction furnace and heating the substrate while feeding a gas into the furnace to diffuse a source for nanostructures from the substrate, thus completing the production of the nanostructures. At this time, a force can be applied so that the metal present on the substrate is included in the nanostructures upon growth of the nanostructures.

On the other hand, the vapor-liquid-solid (VLS) method employed in the present invention can be carried out by introducing the substrate on which the template is placed into a reaction furnace and heating the substrate while feeding a gas and a source for nanostructures to produce the nanostructures.

Specifically, the gas used in the solid-liquid-solid (SLS) and vapor-liquid-solid (VLS) methods can be selected from the group consisting of Ar, $N_2$, He, and $H_2$, but is not limited thereto.

Both solid-liquid-solid (SLS) and vapor-liquid-solid (VLS) methods can be carried out under a pressure of 760 torr or less. The solid-liquid-solid (SLS) method can be carried out at a temperature of 800-1,200° C., and the vapor-liquid-solid (VLS) method can be carried out at a temperature of 370-600° C. On the other hand, when it is intended to produce silicon nanowires as the nanostructures by the vapor-liquid-solid (VLS) method, $SiH_4$, $SiCl_4$ or $SiH_2Cl_2$ can be used as a source for the silicon nanowires.

iii) Removal of Template

After the nanostructures are formed within the holes of the porous template, as shown in FIG. 1, the template is removed using an etchant, e.g., hydrofluoric acid, to obtain pure nanostructures. Specifically, the removal of the template can be achieved by etching using a solvent selective for the template and the nanostructures.

Step (b): Dispersion of Nanostructures

The nanostructures produced using the porous template are dispersed in a source or precursor material for the final porous material. As the source or precursor material for the porous material, there can be used a liquid precursor of a metal, a metal oxide, a polymer or carbon nanotubes, which is similar to the material for the nanostructures. However, the source or precursor material for the porous material must be different from the material for the nanostructures so that the template can be selectively removed during etching.

The precursor material is dissolved in a dispersion solvent, such as an organic solvent or water, before use. If required, a dispersant may be further added so that the nanostructures are readily dispersed in the precursor solution. The dispersant used herein consists essentially of a head containing a polar group capable of being adsorbed on the surface of quantum dots and an apolar tail capable of being adsorbed to a binder. Examples of preferred dispersants include, but are not limited to, those consisting essentially of a head containing a polar group, e.g., an amine group or its salt, a carboxylic group or its salt, a phosphoric acid group or its salt, a sulfonic acid group or its salt or a hydroxyl group, and a tail selected from polyethylene glycol, polypropylene glycol and $C_5$-$C_{30}$ alkyl groups. It is preferred that the dispersant be highly compatible with the binder used.

Step (c): Alignment of Nanostructures

After the nanostructures are dispersed in the source or precursor material for the porous material, the orientation of the nanostructures is controlled in such a manner that the nanostructures are aligned in a particular direction. The control over the orientation of the nanostructures enables utilization of optical properties, such as mobility of electrons or polarization in a particular direction.

The alignment of the nanostructures can be achieved by applying an electrical or magnetic field to the dispersion or by mechanically controlling the flow direction of the dispersion medium. For example, the alignment of the nanostructures using the flow direction of the dispersion medium is achieved by the method described in Charles Lieber et al., Science 291 (2001) p 630~633. This method uses a polymer (PDMS) mold in which channels having a width of from about tens to about hundreds of micrometers and a length of from about hundreds of micrometers to several millimeters are formed. A dispersion of nanostructures in an appropriate dispersion medium (e.g., an organic solvent or water) is sprayed at a high velocity on the channels of the PDMS mold placed on a substrate, and as a result, the nanostructures are aligned in a flow direction of a fluid along the PDMS channels on the substrate. The density per unit area and orientation of the aligned nanostructures can be controlled by varying various factors, e.g., the flow rate of the fluid flowing along the PDMS channels, the retention time of the fluid in the channels, and the chemical properties and composition of the substrate.

Step (d): Removal of Nanostructures

Finally, the nanostructures are removed by etching, leaving the final porous material. The etching of the nanostructures can be performed by various processes according to the kind of the material for the nanostructures and the kind of the source or precursor material for dispersing the nanostructures. The selective removal of the nanostructures from the source material can be achieved by etching using a solution selective for the nanostructures and the source material, or calcining.

For example, nanostructures made of a metal can be etched using nitric or sulfuric acid. Nanostructures made of a metal oxide can be etched using a hydrofluoric acid solution. Nanostructures made of an organic polymeric material can be removed by pyrolysis at a high temperature of 500° C. or higher. For example, when the nanostructures are made of polystyrene, they are thermally decomposed by calcining at 500-550° C. for 6-7 hours, leaving the final porous material.

In another aspect, the present invention is directed to a porous material prepared by the method. The porous material of the present invention has regularly aligned, highly oriented pores of uniform size. Since the size, shape, orientation, anisotropy and regularity of the pores can be readily controlled, the porous material of the present invention can find a variety of applications, including catalysts, separation systems, low-dielectric constant materials, hydrogen storage materials, photonic crystal bandgap materials, and the like.

Although the present invention has been described herein with reference to the foregoing embodiments, these embodiments do not serve to limit the scope of the present invention. Accordingly, those skilled in the art to which the present invention pertains will appreciate that various modifications are possible, without departing from the technical spirit of the present invention.

As apparent from the above description, according to the method of the present invention, a porous material can be easily prepared by the use of nanostructures produced using a porous template. The porous material prepared by the method of the present invention has regularly aligned pores of uniform size. In addition, since the size, shape, regularity, anisotropy and orientation of the pores can be readily controlled, the porous material of the present invention can be utilized in a variety of applications.

What is claimed is:

1. A method for preparing a porous material using nanostructures, the method comprising the steps of:
   (a) producing nanostructures using a porous template;
   (b) dispersing the nanostructures in a source or a precursor material for a porous material;
   (c) aligning the nanostructures in a particular direction; and
   (d) removing the nanostructures by etching.

2. The method according to claim 1, wherein the nanostructures are nanorods, nanowires, or nanotubes.

3. The method according to claim 1, wherein the step of producing nanostructures includes the sub-steps of:
   i) providing a porous template having a plurality of holes;
   ii) producing nanostructures using the template by a solid-liquid-solid (SLS) or vapor-liquid-solid (VLS) method; and
   iii) removing the template.

4. The method according to claim 3, wherein the solid-liquid-solid (SLS) method is carried out by introducing a substrate on which the template is placed into a reaction furnace and heating the substrate while feeding a gas into the furnace to diffuse a source for the nanostructures from the substrate, thus completing the production of the nanostructures.

5. The method according to claim 3, wherein the vapor-liquid-solid (VLS) method is carried out by introducing a substrate on which the template is placed into a reaction furnace and heating the substrate while feeding a gas and a source for the nanostructures to produce the nanostructures.

6. The method according to claim 1, wherein the porous template is made of a material selected from the group consisting of glass, silica, and metal oxides, including $TiO_2$, $ZnO$, $SnO_2$ and $WO_3$.

7. The method according to claim 1, wherein the nanostructures are made of a material selected from the group consisting of metal oxides, metal nitrides, semiconductors, metals, polymers, and carbon nanotubes.

8. The method according to claim 7, wherein the semiconductor is a Group II-VI, Group III-V, Group IV-VI, or Group IV compound semiconductor.

9. The method according to claim 1, wherein the porous template has a diameter of 1 nm to 1 mm and a height of 100 nm to 1 mm.

10. The method according to claim 1, wherein the porous template has holes with a diameter of 1 to 100 nm and a spacing of 2 nm to 1 μm.

11. The method according to claim 1, wherein, in step (b), the nanostructures are dispersed in an aqueous or organic solution in which the precursor material is dissolved, or are dispersed in a solvent containing a dispersant.

12. The method according to claim 1, wherein the source or precursor material is selected from the group consisting of metals, metal oxides, polymers, and carbon nanotubes.

13. The method according to claim 1, wherein, in step (c), an electrical or magnetic field is applied or a mechanical means is used to align the nanostructures.

14. The method according to claim 1, wherein, in step (d), the etching is performed by using an etchant capable of selectively dissolving the nanostructures or by pyrolyzing the nanostructures.

* * * * *